US006983551B2

(12) United States Patent
Ahmad

(10) Patent No.: US 6,983,551 B2
(45) Date of Patent: *Jan. 10, 2006

(54) INTERCONNECTING SUBSTRATES FOR ELECTRICAL COUPLING OF MICROELECTRONIC COMPONENTS

(75) Inventor: Syed Sajid Ahmad, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 279 days.

This patent is subject to a terminal disclaimer.

(21) Appl. No.: 10/266,848

(22) Filed: Oct. 7, 2002

(65) Prior Publication Data

US 2003/0109083 A1    Jun. 12, 2003

Related U.S. Application Data

(62) Division of application No. 09/644,801, filed on Aug. 23, 2000, now Pat. No. 6,483,044.

(51) Int. Cl.
F26B 7/00          (2006.01)

(52) U.S. Cl. .......................... 34/381; 34/400; 34/514; 257/669

(58) Field of Classification Search .................. 34/381, 34/400, 514; 29/832; 174/255
See application file for complete search history.

(56) References Cited

U.S. PATENT DOCUMENTS

| 3,672,046 | A | 6/1972 | Storey, II et al |
|---|---|---|---|
| 4,012,307 | A | 3/1977 | Phillips |
| 4,285,780 | A | 8/1981 | Schachter |
| 4,769,344 | A | 9/1988 | Sakai et al. |
| 4,777,520 | A | 10/1988 | Nambu et al. |
| 4,855,807 | A | 8/1989 | Yamaji et al. |
| 4,866,506 | A | 9/1989 | Nambu et al. |
| 4,882,212 | A | 11/1989 | SinghDeo et al. |
| 4,887,149 | A | 12/1989 | Romano |

(Continued)

FOREIGN PATENT DOCUMENTS

JP              60208847 A       10/1985

(Continued)

OTHER PUBLICATIONS

U.S. Appl. No. 10/267,080, filed Oct. 7, 2002, Ahmad.

(Continued)

Primary Examiner—Stephen Gravini
(74) Attorney, Agent, or Firm—Perkins Coie LLP

(57) ABSTRACT

Interconnecting substrates used in the manufacturing of microelectronic devices and printed circuit assemblies, packaged microelectronic devices having interconnecting substrates, and methods of making and using such interconnecting substrates. In one aspect of the invention, an interconnecting substrate comprises a first external layer having a first external surface, a second external layer having a second external surface, and a conductive core between the first and second external layers. The conductive core can have at least a first conductive stratum between the first and second external layers, and a dielectric layer between the first conductive stratum and one of the first or second external layers. The conductive core can also include a second conductive stratum such that the first conductive stratum is on a first surface of the dielectric layer and the second conductive stratum is on a second surface of the dielectric layer. The interconnecting substrate also has at least one vent through at least one of the first conductive stratum, the second conductive stratum, and/or the dielectric layer. The vent is configured to direct moisture away from the dielectric layer, and thus the vent can be a moisture release element that allows moisture to escape from the dielectric layer during high temperature processing.

14 Claims, 3 Drawing Sheets

U.S. PATENT DOCUMENTS

| | | |
|---|---|---|
| 5,107,328 A | 4/1992 | Kinsman |
| 5,128,831 A | 7/1992 | Fox, III et al. |
| 5,138,434 A | 8/1992 | Wood et al. |
| 5,147,821 A | 9/1992 | McShane et al. |
| 5,191,174 A | 3/1993 | Chang et al. |
| 5,195,023 A | 3/1993 | Manzione et al. |
| 5,197,183 A | 3/1993 | Chia et al. |
| 5,208,467 A | 5/1993 | Yamazaki |
| 5,296,738 A | 3/1994 | Freyman et al. |
| 5,309,026 A | 5/1994 | Matsumoto |
| 5,314,842 A | 5/1994 | Sawaya et al. |
| 5,363,280 A | 11/1994 | Chobot et al. |
| 5,365,655 A | 11/1994 | Rose |
| 5,449,427 A | 9/1995 | Wojnarowski et al. |
| 5,474,958 A | 12/1995 | Djennas et al. |
| 5,527,743 A | 6/1996 | Variot |
| 5,578,261 A | 11/1996 | Manzione et al. |
| 5,593,927 A | 1/1997 | Farnworth et al. |
| 5,596,231 A | 1/1997 | Combs |
| 5,606,204 A | 2/1997 | Tsuji |
| 5,609,889 A | 3/1997 | Weber |
| 5,612,576 A * | 3/1997 | Wilson et al. .............. 257/788 |
| 5,624,864 A | 4/1997 | Arita et al. |
| 5,635,220 A | 6/1997 | Izumi et al. |
| 5,665,281 A | 9/1997 | Drummond |
| 5,665,296 A | 9/1997 | Jain et al. |
| 5,677,566 A | 10/1997 | King et al. |
| 5,696,033 A | 12/1997 | Kinsman |
| 5,710,071 A | 1/1998 | Beddingfield et al. |
| 5,721,450 A | 2/1998 | Miles |
| 5,728,600 A | 3/1998 | Saxelby, Jr. et al. |
| 5,739,585 A | 4/1998 | Akram et al. |
| 5,750,423 A | 5/1998 | Ishii |
| D394,844 S | 6/1998 | Farnworth et al. |
| 5,766,649 A | 6/1998 | Azuma |
| 5,767,446 A | 6/1998 | Ha et al. |
| 5,773,322 A | 6/1998 | Weld |
| 5,780,351 A | 7/1998 | Arita et al. |
| 5,793,613 A | 8/1998 | Pionelli et al. |
| 5,796,159 A | 8/1998 | Kierse |
| 5,815,000 A | 9/1998 | Farnworth et al. |
| D402,638 S | 12/1998 | Farnworth et al. |
| 5,842,275 A | 12/1998 | McMillan, II et al. |
| 5,851,845 A | 12/1998 | Wood et al. |
| 5,866,953 A | 2/1999 | Akram et al. |
| 5,891,753 A | 4/1999 | Akram |
| 5,893,726 A | 4/1999 | Farnworth et al. |
| 5,898,224 A | 4/1999 | Akram |
| 5,917,234 A | 6/1999 | Tsuruzono |
| 5,920,768 A | 7/1999 | Shintai |
| 5,928,595 A | 7/1999 | Knapp et al. |
| 5,933,713 A | 8/1999 | Farnworth |
| 5,938,956 A | 8/1999 | Hembree et al. |
| 5,945,130 A | 8/1999 | Saxelby, Jr. et al. |
| 5,946,553 A | 8/1999 | Wood et al. |
| 5,958,100 A | 9/1999 | Farnworth et al. |
| 5,964,030 A | 10/1999 | Lee et al. |
| 5,986,209 A | 11/1999 | Tandy |
| 5,989,941 A | 11/1999 | Wensel |
| 5,990,566 A | 11/1999 | Farnworth et al. |
| 5,994,784 A | 11/1999 | Ahmad |
| RE36,469 E | 12/1999 | Wood et al. |
| 5,998,243 A | 12/1999 | Odashima et al. |
| 6,000,924 A | 12/1999 | Wang et al. |
| 6,008,070 A | 12/1999 | Farnworth |
| 6,013,946 A | 1/2000 | Lee et al. |
| 6,015,987 A | 1/2000 | Arita et al. |
| 6,020,629 A | 2/2000 | Farnworth et al. |
| 6,025,728 A | 2/2000 | Hembree et al. |
| 6,028,365 A | 2/2000 | Akram et al. |
| 6,046,496 A | 4/2000 | Corisis et al. |
| 6,048,744 A | 4/2000 | Corisis et al. |
| 6,048,755 A | 4/2000 | Jiang et al. |
| 6,049,125 A | 4/2000 | Brooks et al. |
| 6,054,755 A | 4/2000 | Takamichi et al. |
| 6,066,514 A | 5/2000 | King et al. |
| 6,071,758 A | 6/2000 | Steffen |
| 6,072,236 A | 6/2000 | Akram et al. |
| 6,075,288 A | 6/2000 | Akram |
| 6,080,932 A | 6/2000 | Smith et al. |
| 6,089,920 A | 7/2000 | Farnworth et al. |
| 6,094,058 A | 7/2000 | Hembree et al. |
| 6,097,087 A | 8/2000 | Farnworth et al. |
| 6,100,598 A | 8/2000 | Kanesaka |
| 6,103,547 A | 8/2000 | Corisis et al. |
| 6,107,122 A | 8/2000 | Wood et al. |
| 6,107,680 A | 8/2000 | Hodges |
| 6,114,189 A | 9/2000 | Chia et al. |
| 6,117,382 A | 9/2000 | Thummel |
| 6,124,634 A | 9/2000 | Akram et al. |
| 6,126,428 A | 10/2000 | Mitchell et al. |
| 6,143,581 A | 11/2000 | Johnson et al. |
| 6,150,717 A | 11/2000 | Wood et al. |
| 6,159,764 A | 12/2000 | Kinsman et al. |
| 6,168,970 B1 | 1/2001 | Burns |
| 6,172,419 B1 | 1/2001 | Kinsman |
| 6,175,159 B1 | 1/2001 | Sasaki |
| 6,184,465 B1 | 2/2001 | Corisis |
| 6,191,472 B1 | 2/2001 | Mazumder |
| 6,198,172 B1 | 3/2001 | King et al. |
| 6,208,519 B1 | 3/2001 | Jiang et al. |
| 6,210,992 B1 | 4/2001 | Tandy et al. |
| 6,215,175 B1 | 4/2001 | Kinsman |
| 6,228,548 B1 | 5/2001 | King et al. |
| 6,228,687 B1 | 5/2001 | Akram et al. |
| 6,229,202 B1 | 5/2001 | Corisis |
| 6,235,994 B1 | 5/2001 | Chamberlin et al. |
| 6,242,802 B1 | 6/2001 | Miles et al. |
| 6,246,108 B1 | 6/2001 | Corisis et al. |
| 6,252,298 B1 | 6/2001 | Lee et al. |
| 6,258,623 B1 | 7/2001 | Moden et al. |
| 6,258,624 B1 | 7/2001 | Corisis |
| 6,259,153 B1 | 7/2001 | Corisis |
| 6,262,480 B1 | 7/2001 | Ferri et al. |
| 6,277,671 B1 | 8/2001 | Tripard |
| 6,284,571 B1 | 9/2001 | Corisis et al. |
| 6,291,894 B1 | 9/2001 | Farnworth et al. |
| 6,291,895 B1 | 9/2001 | Taniguchi et al. |
| 6,294,839 B1 | 9/2001 | Mess et al. |
| 6,300,165 B2 | 10/2001 | Castro |
| 6,303,981 B1 | 10/2001 | Moden |
| 6,303,985 B1 | 10/2001 | Larson et al. |
| 6,309,916 B1 | 10/2001 | Crowley et al. |
| 6,310,390 B1 | 10/2001 | Moden |
| 6,314,639 B1 | 11/2001 | Corisis |
| 6,316,285 B1 | 11/2001 | Jiang et al. |
| 6,324,069 B1 * | 11/2001 | Weber ....................... 361/783 |
| 6,326,242 B1 | 12/2001 | Broods et al. |
| 6,326,244 B1 | 12/2001 | Brooks et al. |
| 6,326,687 B1 | 12/2001 | Corisis |
| 6,326,697 B1 | 12/2001 | Farnworth |
| 6,326,698 B1 | 12/2001 | Akram |
| 6,329,220 B1 | 12/2001 | Bolken et al. |
| 6,329,603 B1 | 12/2001 | Japp et al. |
| 6,331,221 B1 | 12/2001 | Cobbley |
| 6,331,453 B1 | 12/2001 | Bolken et al. |
| 6,332,766 B1 | 12/2001 | Thummel |
| 6,338,813 B1 | 1/2002 | Hsu et al. |
| 6,403,009 B1 | 6/2002 | Saxelby, Jr. et al. |
| 6,413,801 B1 | 7/2002 | Lin |
| 6,472,252 B2 | 10/2002 | Mess |
| 6,483,044 B1 | 11/2002 | Ahmad |
| 2001/0038144 A1 | 11/2001 | Grigg |
| 2002/0016023 A1 | 2/2002 | Bolken |

| | | | |
|---|---|---|---|
| 2002/0048843 A1 | 4/2002 | Bolken | |
| 2002/0050654 A1 | 5/2002 | Bolken | |
| 2002/0052063 A1 | 5/2002 | Bolken | |
| 2002/0175399 A1 | 11/2002 | James et al. | |
| 2003/0029633 A1 | 2/2003 | Ahmad | |

FOREIGN PATENT DOCUMENTS

| | | |
|---|---|---|
| JP | 62-032622 | 2/1987 |
| JP | 62229949 A | 10/1987 |
| JP | 01-244629 | 9/1989 |
| JP | 05299536 A | 11/1993 |
| JP | 10065043 A | 3/1998 |
| JP | 11017048 A | 1/1999 |
| JP | 11026489 A | 1/1999 |
| JP | 11077733 A | 3/1999 |
| JP | 2000-106375 | 4/2000 |
| JP | 2001-076689 | 3/2001 |
| JP | 2001085565 A | 3/2001 |
| KR | 2001038773 A | 5/2001 |

OTHER PUBLICATIONS

U.S. Appl. No. 09/645,640, filed Aug. 24, 2000, James et al.

U.S. Appl. No. 09/649,428, filed Aug. 28, 2000, Cobbley.

* cited by examiner

INTERCONNECTING SUBSTRATES FOR ELECTRICAL COUPLING OF MICROELECTRONIC COMPONENTS

CROSS REFERENCE TO RELATED APPLICATION

This application is a divisional of U.S. patent application Ser. No. 09/644,801, filed on Aug. 23, 2000 now U.S. Pat. No. 6,483,044.

TECHNICAL FIELD

The present invention relates to microelectronic devices and methods for manufacturing and using microelectronic devices. More specifically, several aspects of the invention are directed toward interconnecting substrates that electrically couple microelectronic components, such as packaged microelectronic devices, to other components.

BACKGROUND

Printed circuit boards (PCBs) and interposing substrates are types of interconnecting substrates for electrically connecting microelectronic components together. In a typical application used in semiconductor manufacturing, a packaged microelectronic device includes an interconnecting substrate, a microelectronic die attached to the interconnecting substrate, and a protective casing covering the die. Such packaged microelectronic devices are generally known as Flip-Chip, Chip-On-Board, or Board-On-Chip devices. The interconnecting substrates used in packaged microelectronic devices typically include a plurality of contact elements coupled to bond-pads on the die, a plurality of ball-pads on at least one side of the interconnecting substrate, and conductive traces coupling each contact element to a corresponding ball-pad. Packaged microelectronic devices using an interconnecting substrate are generally surface mounted to another interconnecting substrate, such as a PCB, in the fabrication of Printed Circuit Assemblies (PCAs).

The competitive semiconductor manufacturing and printed circuit assembly industries are continually striving to miniaturize the microelectronic devices and the PCAs for use in laptop computers, hand-held computers, and communication products. Additionally, there is a strong drive to increase the operating frequencies of the microelectronic devices. The trends of miniaturization and high operating frequencies further drive the need to increase the density of traces and contacts on PCBs and other types of interconnecting substrates. Therefore, several high frequency packaged microelectronic devices require shielding to protect the integrity of the signals on the interconnecting substrate from capacitive coupling and/or inductive coupling.

In conventional PCB technologies, the signal integrity is protected by providing ground and power planes in the interconnecting substrates. Such use of ground and power planes in conventional interconnecting substrates has been limited to robust PCBs that are fairly thick. The miniaturization of components, however, often requires very thin interconnecting substrates for packaging microelectronic devices. One manufacturing concern of using ground and power planes in such thin interconnecting substrates is that high-temperature processing can cause voids to form in the substrates or delamination of the substrates. The substrates may also warp during high temperature processing.

To resolve the problems of voids, delamination and warping, the interconnecting substrates are typically preheated to remove moisture from the dielectric materials. One drawback of preheating the interconnecting substrates is that it is time-consuming and increases the cost of packaging microelectronic devices and fabricating PCAs. Additionally, although such preheating techniques are generally satisfactory for removing a sufficient amount of moisture from low-density, thick PCBs, preheating may still cause unacceptable voids or delamination in thin, high-density interconnecting substrates used in packaged microelectronic devices. The thicker conventional PCBs can have some voids and/or delamination without affecting the performance of the PCAs because they have sufficient structural integrity to prevent warpage and lower densities that are not likely affected by voids or slight delamination. In contrast to thick, low-density PCBs, the thin interconnecting substrates that are used in highly miniaturized applications may not have the structural integrity or sufficient open real estate to withstand preheating or subsequent high-temperature processing even after being preheated. Therefore, there is a need to develop a thin, high-density interconnecting substrate that can withstand high-temperature processes and is suitable for high density, high frequency applications.

SUMMARY

The present invention is directed toward interconnecting substrates used in the manufacturing of microelectronic devices and printed circuit assemblies, packaged microelectronic devices having interconnecting substrates, and methods of making and using such interconnecting substrates. In one aspect of the invention, an interconnecting substrate comprises a first external layer having a first external surface, a second external layer having a second external surface, and a conductive core between the first and second external layers. The conductive core can have at least a first conductive stratum between the first and second external layers, and a dielectric layer between the first conductive stratum and one of the first or second external layers. The conductive core can also include a second conductive stratum such that the first conductive stratum is on a first surface of the dielectric layer and the second conductive stratum is on a second surface of the dielectric layer. The interconnecting substrate also has at least one vent through at least one of the first conductive stratum, the second conductive stratum, and/or the dielectric layer. The vent is configured to direct moisture away from the dielectric layer, and thus the vent can be a moisture release element that allows moisture to escape from the dielectric layer during high temperature processing.

The first conductive stratum can be a ground plane, and the second conductive stratum can be a power plane. Additionally, the vents can comprise holes and/or channels in the first and second conductive stratums. The holes and/or channels can be superimposed with one another, or they can be offset from one another. The vents are located in areas of the first and second conductive stratums that will not affect the electrical integrity of the conductive stratums or the internal wiring of the interconnecting substrate. For example, locations and configurations of the holes, channels or other types of vents can be designed so that they do not adversely affect the signal integrity.

In another aspect of the invention, a method of manufacturing an interconnecting substrate comprises constructing an internal conductive core by disposing a first conductive stratum on a first surface of a dielectric layer; forming at least one vent in at least one of the first conductive stratum and/or the dielectric layer so that the vent is configured to direct moisture away from the dielectric layer; and laminating the internal conductive core between a first external layer and a second external layer. The process of constructing the internal conductive core can also include disposing a second conductive stratum on a second surface of the dielectric layer that is opposite the first surface. The vents can be formed in the first conductive stratum and/or the second conductive stratum by etching holes, channels, and/or other openings through the first and/or second conductive stratums.

DETAILED DESCRIPTION

The following disclosure describes interconnecting substrates used in the manufacturing of microelectronic devices and PCAs, packaged microelectronic devices having interconnecting substrates, and methods for making and using such interconnecting substrates. Many specific details of certain embodiments of the invention are set forth in the following description and in FIGS. 1–5 to provide a thorough understanding of these embodiments. One skilled in the art, however, will understand that the present invention may have additional embodiments, or that the invention may be practiced without several of the details described below.

Figure 1:
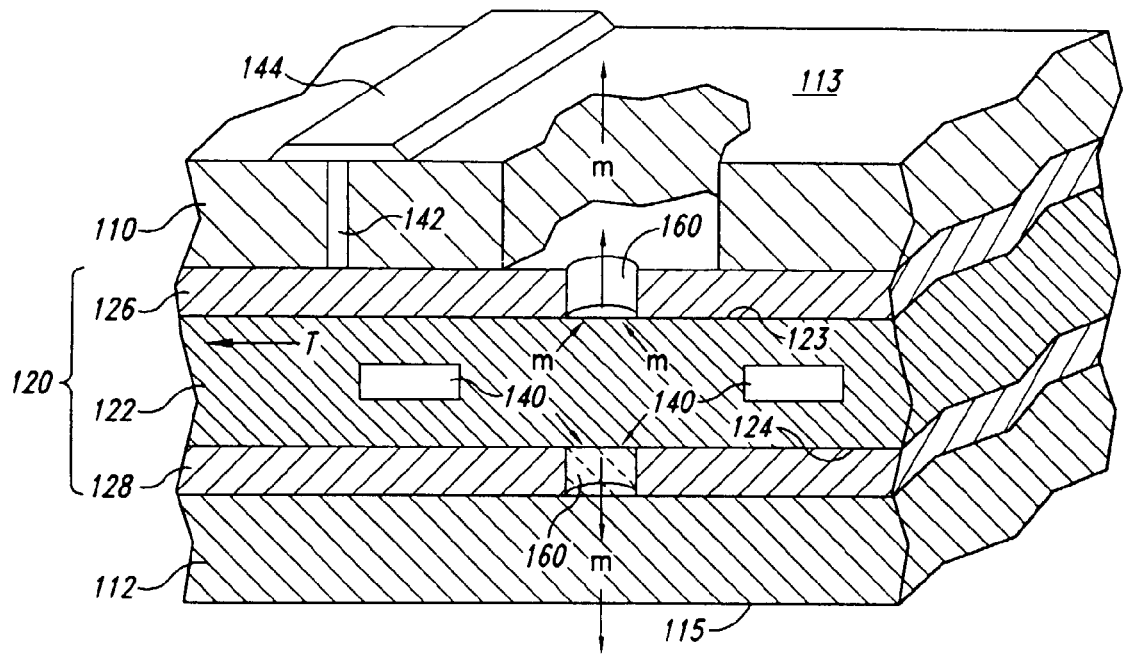
FIG. 1 is a cross-sectional isometric view of a portion of an interconnecting substrate in accordance with an embodiment of the invention.

FIG. 1 is a cross-sectional top isometric view illustrating a portion of an interconnecting substrate 100 in accordance with one embodiment of the invention. In this embodiment, the interconnecting substrate 100 has a first external layer 110, a second external layer 112, and a conductive core 120 laminated between the first and second external layers 110/112. The first and second external layers 110/112 can be composed of a thermoplastic resin (e.g., a polyether sulfone), a polyimide film, or other suitable dielectric materials. The first external layer 110 has a first external surface 113, and the second external layer 112 has a second external surface 115.

The conductive core 120 includes a dielectric separator layer 122 having a first surface 123 and a second surface 124. The dielectric separator layer 122 is typically composed of a material having a high resistivity, such as BT epoxy, FR-4, polyimide, cyanate ester, fluoropolymer composites (e.g., Roger's RO-2800), or epoxy/nonwoven aramids (e.g, DuPont Thermount). These materials provide good dielectric properties, but they absorb enough moisture to affect the structural and electrical integrity of the substrate 100 during manufacturing processes or field operations. The conductive core 120 also includes at least a first conductive stratum 126, and the conductive core 120 preferably also includes a second conductive stratum 128. The first conductive stratum 126 can be disposed on the first surface 123 of the separator layer 122, and the second conductive stratum 128 can be disposed on the second surface 124 of the separator layer 122. The first and second conductive stratums 126/128 are preferably composed of highly conductive materials. For example, the first and second conductive stratums 126/128 are generally composed of copper, but silver, gold, aluminum, tungsten, alloys of these metals, or other conductive materials can also be used.

The interconnecting substrate 100 can be a very thin, high-density unit for coupling a memory device, processor, or other high-frequency microelectronic device to a larger printed circuit board or another component. The interconnecting substrate 100, for example, can have a thickness from the first external surface 113 of the first external layer 110 to the second external surface 115 of the second external layer 112 of approximately 0.01 to 0.25 millimeters, but it can also have a larger thickness. The first and second conductive stratums 126/128 can be ground and power planes, respectively. The first conductive stratum 126 can accordingly be connected to a ground potential, and the second conductive stratum 128 can accordingly be connected to a power potential. Unlike internal wiring within the interconnecting substrate 100 or on the first and second external surfaces 113/115, the first conductive stratum 126 and the second conductive stratum 128 are generally substantially contiguous layers having a surface area approximately equal to the total surface area of the first and second external surfaces 113/115.

The interconnecting substrate 100 can also include a plurality of conductive lines. In one embodiment, the interconnecting substrate 100 has a plurality of signal lines 140 extending through the dielectric separator layer 122. The interconnecting substrate 100 can also include contacts 142 and surface lines 144. The contacts 142 can extend through the first and second external layers 110/112, and the surface lines 144 can extend across the first external surface 113 and/or the second external surface 115. For purposes of simplicity, only a single contact line 142 is shown extending between the first conductive stratum 126 and a surface line 144 on the first external surface 113 of the first external layer 110. It will be appreciated that the configuration of the signal lines 140, contact lines 142, and surface lines 144 are designed according to the specific uses of the interconnecting substrate 100, and thus the invention can include virtually any configuration of such conductive lines. The contacts 142 or vias can couple the ground plane defined by the first conductive stratum 126 and/or the power plane defined by the second conductive stratum 128 to surface lines 144 on one or both of the first and/or second external surfaces 113/115, as is known in the art of PCB manufacturing and design.

The interconnecting substrate 100 also includes at least one vent 160 through at least one of the first conductive stratum 126 and/or the second conductive stratum 128. In the embodiment shown in FIG. 1, the interconnecting substrate 100 includes a first vent 160 in the first conductive stratum 126 and a second vent 160 in the second conductive stratum 128. The first and second vents 160 shown in FIG. 1 are holes that extend through each of the first and second conductive stratums 126/128. Additionally, the vents 160 shown in FIG. 1 are superimposed with one another such that the first vent 160 in the first conductive stratum 126 is aligned with the second vent 160 in the second conductive stratum 128. The vents 160 are configured to direct moisture away from the dielectric layer and into the first and second external layers 110 and 112. As such, the conductive stratums 126/128 do not act as moisture barriers that entrap moisture absorbed by the dielectric layer 122.

The interconnecting substrate 100 can be fabricated by constructing the internal conductive core 120 and then laminating the first and second external layers 110 and 112 to the conductive core 120. In one embodiment, the conductive core 120 is constructed by disposing the first conductive stratum 126 on the first surface 123 of the dielectric layer 122. In applications that also include the second conductive stratum 128, constructing the internal conductive core 120 can further include disposing the second conductive stratum 128 on the second surface 124 of the dielectric layer 122. The vents 160 can be formed in the first conductive stratum 126 and the second conductive stratum 128 by etching the holes through the first and second conductive stratums 126/128 using photolithographic processes known in the semiconductor manufacturing arts. After forming the vents 160, the first and second external layers 110 and 112 can be laminated to the conductive core 120 by aligning the first external layer 110 with the first conductive stratum 126 and aligning the second external layer 112 with the second conductive stratum 128. The first external layer 110, the second external layer 112, and the conductive core 120 are then pressed together using techniques known in the PCB fabricating arts to laminate the first and second external layers 110 and 112 to the conductive core 120. After laminating the first and second external layers 110 and 112 to the conductive core 120, the vents 160 are at least partially filled with material from the first layer 110, the second layer 112, and/or the dielectric layer 112 (shown in broken lines in FIG. 1).

Several embodiments of the interconnecting substrate 100 shown in FIG. 1 are particularly well suited for high temperature processing of very thin, multi-layer substrates used in packaging high frequency microelectronic dies. In a typical application, the interconnecting substrate 100 is subject to elevated temperatures in solder reflow and/or burn-in processes. During such high temperature processing, moisture absorbed by the dielectric layer 122 expands and creates an internal pressure gradient within the interconnecting substrate 100. As the moisture expands, it can pass through the vents 160 in the first and second conductive stratums 126/128 and into the first and second external layers 110/112 (shown by arrows M). The moisture then passes through the first and second external layers 110/112 to dissipate in the external environment. The vents 160 accordingly direct the moisture away from the dielectric layer 122 to the relieve the pressure gradient in the interconnecting substrate 100 caused by expanding moisture.

Several embodiments of the interconnecting substrate 100 are expected to reduce the occurrences of voids and/or delamination in very thin, multi-layer substrates that have a metal ground plane and/or a metal power plane. In conventional multi-layer interconnecting substrates, the ground planes and power planes are contiguous layers that do not have openings designed or otherwise configured to direct moisture away from the dielectric layer. The contiguous ground and power planes in conventional interconnecting substrates are thus moisture barriers that force expanding moisture in conventional multi-layer substrates to travel to the edge of the interconnecting substrate (arrow T) to relieve pressure within the interconnecting substrate. It will be appreciated that the distance along the path of arrow T is much greater than the distance along the path of arrows M. As a result, several embodiments of the interconnecting substrate 100 dissipate the expanding moisture in a manner that limits the pressure gradient within the interconnecting substrate 100 to inhibit the formation of voids or the delamination of the interconnecting substrate 100. The interconnecting substrate 100, therefore, is expected to be particularly useful for Chip-On-Board, Board-On-Chip, Flip-Chip, and other types of microelectronic device packaging that use very thin interconnecting substrates for high frequency devices.

Several embodiments of the interconnecting substrate 100 are also expected to be well suited for packaging microelectronic dies that operate at high frequencies. One manufacturing concern of producing high frequency microelectronic devices is that the high density of the conductive lines and pads on the interconnecting substrate can impair the integrity of the signals because of capacitive coupling and/or inductive coupling. Several embodiments of the interconnecting substrate 100 are expected to shield the conductive components on such high-density interconnecting substrates by providing a ground plane (e.g., the first conductive stratum 126) and/or or a power plane (e.g., the second conductive stratum 128). As such, several embodiments of the interconnecting substrate 100 are particularly useful for packaging memory devices and processors that operate at frequencies over 200 MHz.

Figure 2:
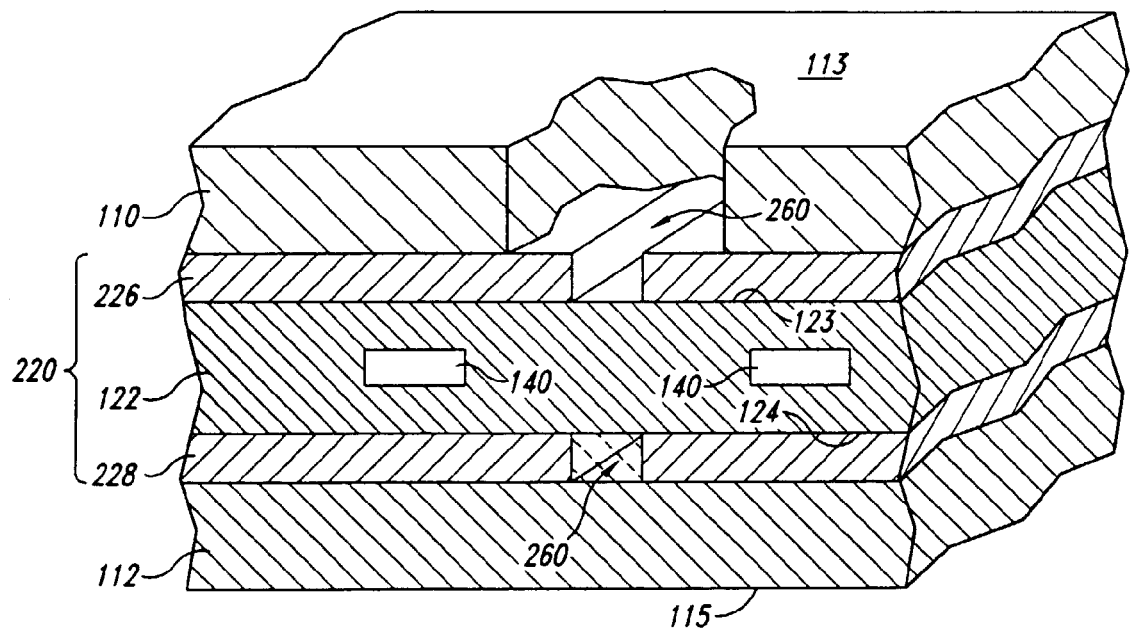
FIG. 2 is a cross-sectional isometric view of a portion of an interconnecting substrate in accordance with another embodiment of the invention.

FIG. 2 is a cross-sectional isometric view of an interconnecting substrate 200 in accordance with another embodiment of the invention. Several components of the interconnecting substrate 200 are similar to the components of the interconnecting substrate 100 illustrated above in FIG. 1, and thus like reference numbers refer to like components in FIGS. 1 and 2. The interconnecting substrate 200 accordingly includes the first and second external layers 110 and 112. The interconnecting substrate 200 can also include a conductive core 220 having the dielectric layer 122, the signal lines 140 through the dielectric layer 122, a first conductive stratum 226 on one surface of the dielectric layer 122, and a second conductive stratum 228 on an opposing surface of the dielectric layer 122. In an alternative embodiment, the conductive core 220 can have only one of the first conductive stratum 226 or the second conductive stratum 228 on one side of the dielectric layer 122. The interconnecting substrate 200 can also include a plurality of vents 260 in one or both of the first and second conductive stratums 226/228. In this embodiment, the vents 260 are elongated channels extending through at least a portion of the first conductive stratum 226 and/or the second conductive stratum 228. The channels 260 generally have short lengths to protect the signal integrity and provide an adequate return path for the first and second conductive stratums 226/228. The channels 260, however, can also have long lengths if such vents do not affect the operation of the stratums 226/228. The vents 260 can be superimposed with one another for at least a portion of their lengths, and they are generally filled with material from the first layer 110, the second layer 112, and/or the dielectric layer 112 (shown in broken lines). In operation, the vents 260 are expected to direct moisture away from the dielectric layer 122 in a manner similar to the vents 160 of the interconnecting substrate 100. As a result, the interconnecting substrate 200 is also expected to reduce the formation of voids or delamination of the various layers in the interconnecting substrate 200 during high temperature processing.

Figure 3:
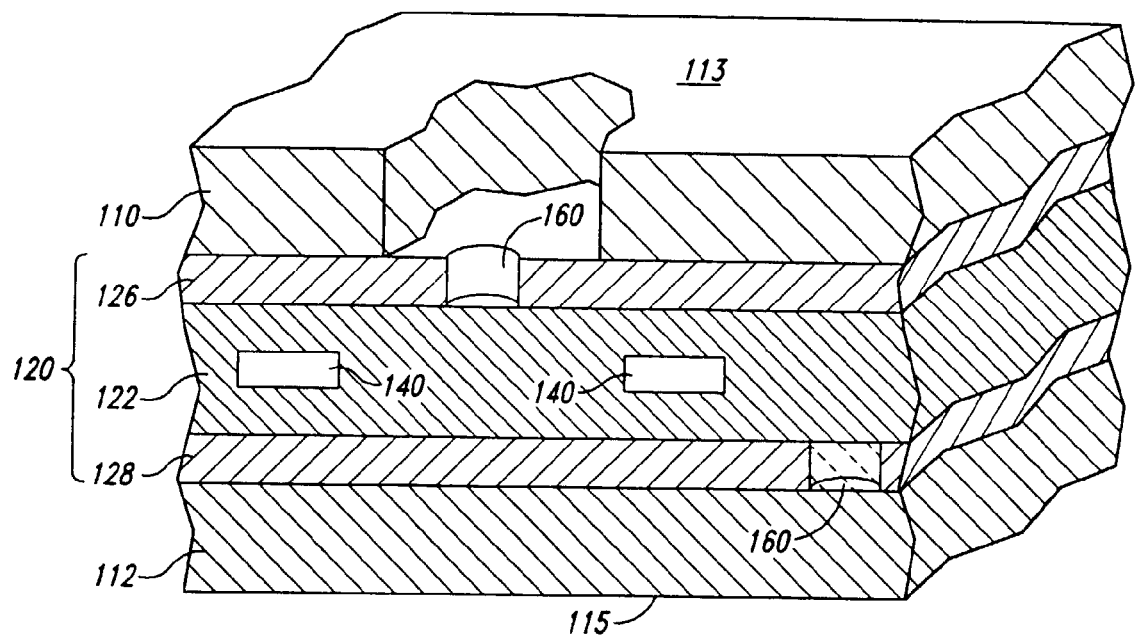
FIG. 3 is a cross-sectional isometric view of an interconnecting substrate in accordance with yet another embodiment of the invention.

FIG. 3 is a cross-sectional top isometric view showing a portion of an interconnecting substrate 300 in accordance with another embodiment of the invention. The interconnecting substrate 300 can have the first external layer 110, the second external layer 112, and the conductive core 120 between the first and second external layers 110 and 112. The conductive core 120 can also include the dielectric layer 122, the first conductive stratum 126 on one side of the dielectric layer 122, and the second conductive stratum 128 on the other side of the dielectric layer 122. The difference between the interconnecting substrate 300 in FIG. 3 and the interconnecting substrate 100 in FIG. 1 is that the interconnecting substrate 300 has a plurality of vents 160 that are offset from each other. The interconnecting substrate 300, for example, can have a first vent 160 between two signal lines 140 and a second vent 160 in the second conductive substrate 128 offset from the first vent 160. The vents 160 shown in FIG. 3 can also be channels similar to the vents 260 shown in FIG. 2. Additionally, in alternative embodiments, the vents 160 and 260 illustrated in FIGS. 1–3 can be combined into a single device such that an interconnecting substrate has vents that are holes and/or channels that are superimposed with one another and/or offset from one another. Additionally, the vents can have other shapes that are neither cylindrical nor rectilinear according to the particular structure of the signal lines and other features of the interconnecting substrates.

Figure 4:
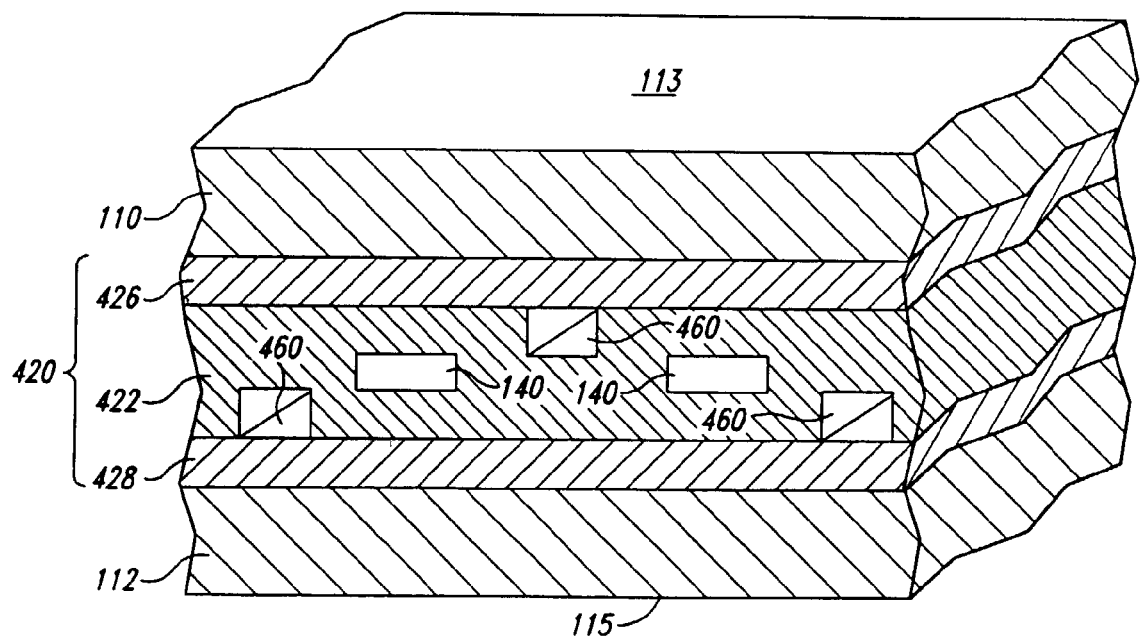
FIG. 4 is a cross-sectional isometric view of an interconnecting substrate in accordance with still another embodiment of the invention.

FIG. 4 is a cross-sectional top isometric view illustrating a portion of an interconnecting substrate 400 in accordance with another embodiment of the invention. The interconnecting substrate 400 has the first external layer 110 and the second external layer 112. The interconnecting substrate 400 also includes a conductive core 420 having a dielectric separator layer 422, a first conductive stratum 426 on one side of the dielectric layer 422, and a second conductive stratum 428 on another side of the dielectric layer 422. The first and second conductive stratums 426/428 can be solid layers of a metal material without any vents. The interconnecting substrate 400 can also include a plurality of vents 460 defined by channels extending through the dielectric layer 422. The vents 460 generally extend to the edge of the interconnecting substrate 400 so that moisture within the dielectric layer 422 can escape from the conductive core 420 at the edge of the interconnecting substrate 400. The vents 460 are generally at least partially filled with material from the dielectric layer 422. In an alternative embodiment, the first and second conductive stratums 426/428 can have vents similar to the first and second conductive stratums 126, 226, 128 or 228 shown above with reference to FIGS. 1–3. The configuration of the vents 460 in the dielectric layer 422 can accordingly be combined with any of the vents 160 and 260 in the conductive stratums shown above with reference to FIGS. 1–3. In operation, therefore, the expanding moisture in the dielectric layer 422 can be directed away from the dielectric layer 422 through the vents 460 to the edge of the interconnecting substrate 400 in addition to, or in lieu of, any vents 160 or 260 in the first and second conductive stratums 426/428.

Figure 5:
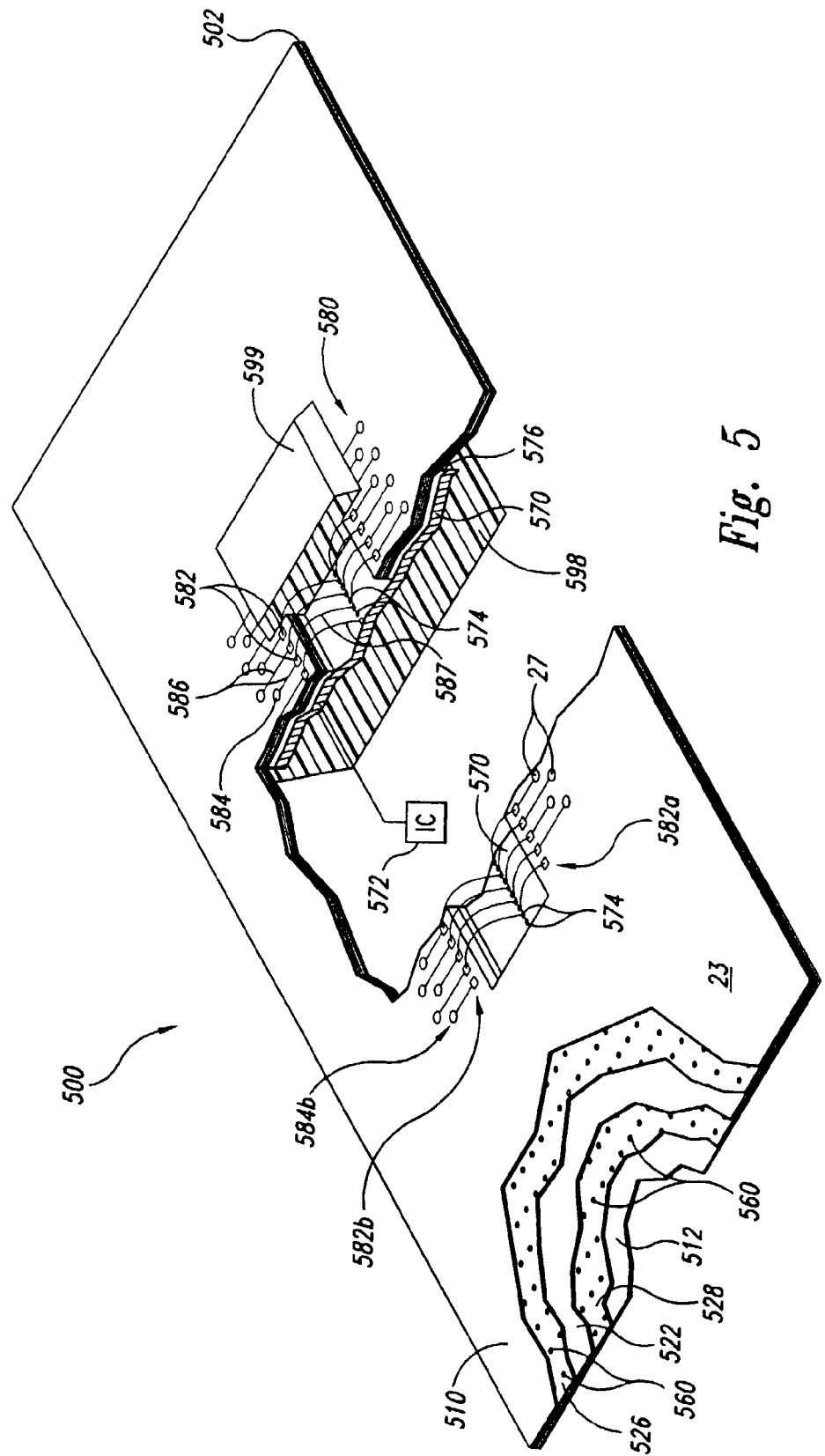
FIG. 5 is a top isometric view having a cut-away portion of a packaged microelectronic device and an interconnecting substrate in accordance with an embodiment of the invention.

FIG. 5 is a cut-away top isometric view of a packaged microelectronic device 500 having an interconnecting substrate 502 in accordance with an embodiment of the invention. The microelectronic device 500 can also include a microelectronic die 570 attached to one side of the interconnecting substrate 502, a first protective casing 598 covering at least a portion of the die 570, and a second protective casing 599 covering a top side of the die 570 and a portion of the interconnecting substrate 502. The microelectronic die 570 can be memory device, a processor, or another type of component that has an integrated circuit 572 and a plurality of bond-pads 574 coupled to the integrated circuit 572.

The interconnecting substrate 502 can be similar to any of the interconnecting substrates 100, 200, 300, or 400 illustrated and described above with reference to FIGS. 1-4. For example, the interconnecting substrate 502 can have a first external layer 510, a second external layer 512, and a conductive core between the first and second external layers 510 and 512. The conductive core can include a dielectric separator layer 522 and at least a first conductive stratum 526 on one side of the dielectric layer 522. The conductive core can also include a second conductive stratum 528 on another side of the dielectric layer 522. The interconnecting substrate 502 also includes a plurality of vents 560 in either the first conductive stratum 526, the second conductive stratum 528, and/or the dielectric layer 522. The vents 560 can be holes, channels or other features that are configured to direct moisture away from the dielectric layer 522 to the edge of the interconnecting substrate 502 and/or the first and second external layers 510 and 512. The structure of the first external layer 510, second external layer 512, the dielectric layer 522, and the first and second conductive stratums 526/528 can be similar to those described above with reference to FIGS. 1–4.

The interconnecting substrate 502 can also include a plurality of contact elements 582, a plurality of ball-pads 584, and a plurality of trace lines 586 coupling selected contact elements 582 to corresponding ball-pads 584. The contact elements 582 are further coupled to selected bond-pads 574 on the die 570 by wire-bond lines 587. In certain applications, certain contact elements 582 may be coupled directly to either the first conductive stratum 526 or the second conductive stratum 528 by vertical contacts that go through the various layers of the interconnecting substrate 502. For example, a conductive element 582a can be coupled to a ground plane (e.g, the first conductive stratum 526) or a power plane (e.g., the second conductive stratum 528) by a contact (not shown) extending through the interconnecting substrate 502 to the ground plane or the power plane. The first conductive stratum 526 or the second conductive stratum 528 can also be coupled to either a ground potential or a power potential by a ball-pad 584b coupled to the selected potential and a contact element 582b coupled to the ball-pad 584b and the first conductive stratum 526 or the second conductive stratum 528.

From the foregoing, it will be appreciated that specific embodiments of the invention have been described herein for purposes of illustration, but that various modifications may be made without deviating from the spirit and scope of the invention. Accordingly, the invention is not limited except by the appended claims.

What is claimed is:

1. A method of processing a packaged microelectronic device having a microelectronic die, an interconnecting substrate attached to the die, and a protective casing covering at least a portion of the die, the interconnecting substrate comprising a dielectric layer, at least a first conductive stratum on the dielectric layer, and first and second external layers around the dielectric layer and the first conductive stratum, the method comprising:
   heating the microelectronic device; and
   passing moisture from the dielectric layer through a vent in the first conductive stratum.

2. The method of claim 1 wherein:
   the vent comprises a hole in the first conductive stratum; and passing moisture through the first conductive stratum comprises driving the moisture through the hole.

3. The method of claim 1 wherein:
the vent comprises a channel in the first conductive stratum; and
passing moisture through the first conductive stratum comprises driving the moisture through the channel.

4. The method of claim 1 wherein:
the interconnecting substrate further comprises a second conductive stratum on the dielectric layer such that the first conductive stratum is on a first surface of the dielectric layer and the second conductive stratum is on a second surface of the dielectric layer;
the first conductive stratum has a first vent and the second conductive stratum has a second vent; and
the method comprises passing moisture through the first vent and passing moisture through the second vent.

5. The method of claim 4 wherein:
the first vent is a first hole and the second vent is a second hole superimposed with the first hole; and
passing the moisture through the first and second vents comprises driving the moisture through the first and second holes.

6. The method of claim 4 wherein:
the first vent is a first hole and the second vent is a second hole offset relative to the first hole; and
passing the moisture through the first and second vents comprises driving the moisture through the first and second holes.

7. The method of claim 4 wherein:
the first vent comprises a first channel and the second vent comprises a second channel; and
passing the moisture through the first and second vents comprises driving the moisture through the first and second channels.

8. A method of processing a packaged microelectronic device, the method comprising:
heating the microelectronic device, wherein the microelectronic device includes a microelectronic die, an interconnecting substrate attached to the die, and a protective casing covering at least a portion of the die, and wherein the interconnecting substrate includes a dielectric layer, at least a first conductive stratum on the dielectric layer, and first and second external layers around the dielectric layer and the first conductive layer; and passing moisture from the dielectric layer through a vent in the first conductive stratum.

9. The method of claim 8 wherein:
the vent comprises a hole in the first conductive stratum; and
passing moisture through the first conductive stratum comprises driving the moisture through the hole.

10. The method of claim 8 wherein:
the vent comprises a channel in the first conductive stratum; and
passing moisture through the first conductive stratum comprises driving the moisture through the channel.

11. The method of claim 8 wherein:
the interconnecting substrate further comprises a second conductive stratum on the dielectric layer such that the first conductive stratum is on a first surface of the dielectric layer and the second conductive stratum is on a second surface of the dielectric layer;
the first conductive stratum has a first vent and the second conductive stratum has a second vent; and
the method comprises passing moisture through the first vent and passing moisture through the second vent.

12. The method of claim 11 wherein:
the first vent is a first hole and the second vent is a second hole superimposed with the first hole; and
passing the moisture through the first and second vents comprises driving the moisture through the first and second holes.

13. The method of claim 11 wherein:
the first vent is a first hole and the second vent is a second hole offset relative to the first hole; and
passing the moisture through the first and second vents comprises driving the moisture through the first and second holes.

14. The method of claim 11 wherein:
the first vent comprises a first channel and the second vent comprises a second channel; and
passing the moisture through the first and second vents comprises driving the moisture through the first and second channels.

* * * * *